US012733415B2

(12) United States Patent
Fuse et al.

(10) Patent No.: US 12,733,415 B2
(45) Date of Patent: Sep. 8, 2026

(54) FILM FORMING METHOD AND FILM FORMING APPARATUS

(71) Applicants: Tokyo Electron Limited, Tokyo (JP); University of Yamanashi, Kofu (JP)

(72) Inventors: Takashi Fuse, Nirasaki (JP); Yusuke Kubota, Fuchu (JP); Shuji Azumo, Nirasaki (JP); Tetsuya Sato, Kofu (JP)

(73) Assignees: Tokyo Electron Limited, Tokyo (JP); University of Yamanashi, Kofu (JP)

( * ) Notice: Subject to any disclaimer, the term of this patent is extended or adjusted under 35 U.S.C. 154(b) by 430 days.

(21) Appl. No.: 18/572,913

(22) PCT Filed: Jun. 8, 2022

(86) PCT No.: PCT/JP2022/023061
§ 371 (c)(1),
(2) Date: Dec. 21, 2023

(87) PCT Pub. No.: WO2022/270304
PCT Pub. Date: Dec. 29, 2022

(65) Prior Publication Data

US 2024/0290610 A1 Aug. 29, 2024

(30) Foreign Application Priority Data

Jun. 22, 2021 (JP) ................................. 2021-103284

(51) Int. Cl.

| | |
|---|---|
| ***H01L 21/02*** | (2006.01) |
| ***C23C 16/26*** | (2006.01) |
| ***C23C 16/40*** | (2006.01) |
| ***C23C 16/46*** | (2006.01) |
| ***H10P 14/60*** | (2026.01) |
| ***H10P 14/69*** | (2026.01) |
| ***H10P 14/692*** | (2026.01) |

(52) U.S. Cl.
CPC .......... *H10P 14/6902* (2026.01); *C23C 16/26* (2013.01); *C23C 16/402* (2013.01); *C23C 16/463* (2013.01); *H10P 14/6502* (2026.01); *H10P 14/69215* (2026.01)

(58) Field of Classification Search
None
See application file for complete search history.

(56) References Cited

U.S. PATENT DOCUMENTS 6,171,945 B1 * 1/2001 Mandal ............... H10W 20/077 438/622
2016/0225588 A1 * 8/2016 Shaikh ............. H01J 37/32449

FOREIGN PATENT DOCUMENTS

JP 2007-501902 A 2/2007

* cited by examiner

*Primary Examiner* — Asok K Sarkar
(74) *Attorney, Agent, or Firm* — Armstrong Teasdale LLP

(57) ABSTRACT

A film forming method selectively performs film formation. The film forming method includes a cooling operation and a film forming operation. The cooling operation includes cooling a substrate to a temperature at which molecules of a c-$C_4F_8$ gas and a $SF_6$ gas condense on a surface of the substrate, the substrate having a metal film and a first insulating film exposed on the surface and being supported inside a chamber. The film forming operation includes forming a carbon-containing film on the metal film by supplying a processing gas including the c-$C_4F_8$ gas and the $SF_6$ gas into the chamber while exciting the surface of the substrate.

6 Claims, 9 Drawing Sheets

Block layer
film formation

FIG. 2B

| Processing time | Film thickness of SiO2 (nm) |
|---|---|
| 0min | 97.7 |
| 1min | 96.2 |
| 2min | 95.2 |
| 3min | 94.3 |
| 4min | 93.0 |
| 5min | 91.8 |
| 6min | 90.7 |
| 7min | 89.7 |
| 8min | 88.7 |
| 9min | 87.6 |
| 10min | 86.5 |

FIG. 4B

| Processing time | Film thickness of SiO2 (nm) |
|---|---|
| 0min | 97.9 |
| 1min | 97.0 |
| 2min | 95.7 |
| 3min | 94.5 |
| 4min | 93.4 |
| 5min | 92.3 |
| 6min | 91.2 |
| 7min | 90.1 |
| 8min | 88.9 |
| 9min | 87.8 |
| 10min | 86.7 |

Absorbance (relative value)
0.06
0.05
0.04
0.03
0.02
0.01
0
1100–1400cm⁻¹
CFx
:0min
:2min
:4min
:6min
:8min
:10min
800
900
1000
1100
1200
1300
1400
1500
1600
1700
1800
Wave number(cm⁻¹)

W
200
201

W
200
202
201
Block layer
film formation

W
202
203
200
201
Second insulating layer
film formation

W
203
200
201
Block layer
removal

W
204
203
200
201
Wiring embedding

FILM FORMING METHOD AND FILM FORMING APPARATUS

CROSS-REFERENCE TO RELATED APPLICATIONS

The present application is a U.S. National Stage Entry of International Patent Application No. PCT/JP2022/023061, filed Jun. 8, 2022, which claims the benefit of priority to Japanese Patent Application No. 2021-103284, filed Jun. 22, 2021, each of which is hereby incorporated herein by reference in its entirety.

TECHNICAL FIELD

The present disclosure relates to a film forming method and a film forming apparatus.

BACKGROUND

Patent Document 1 proposes a technique in which a reaction space surface is processed using a processing chemical substance to deactivate the reaction space surface with respect to reactions with a plurality of deposited reactants, and then, a layer is deposited on a substrate by exposing the substrate to the plurality of reactants.

PRIOR ART DOCUMENT

Patent Document

Patent Document 1: Japanese Laid-Open Patent Publication No. 2007-501902

The present disclosure provides a technique for selectively forming a film on a metal film of a substrate with the metal film and an insulating film exposed on a surface thereof without forming a mask.

SUMMARY

A film forming method according to one aspect of the present disclosure selectively performs film formation. The film forming method includes a cooling operation and a film forming operation. The cooling operation includes cooling a substrate to a temperature at which molecules of a c-$C_4F_8$ gas and a $SF_6$ gas condense on a surface of the substrate, the substrate having a metal film and an insulating film exposed on the surface and being supported inside a chamber. The film forming operation includes forming a carbon-containing film on the metal film by supplying a processing gas including the c-$C_4F_8$ gas and the $SF_6$ gas into the chamber while exciting the surface of the substrate.

According to the present disclosure, it is possible to selectively form a film on a metal film of a substrate with the metal film and an insulating film exposed on a surface thereof without forming a mask.

BRIEF DESCRIPTION OF DRAWINGS

FIG. 2B is a diagram illustrating an example of the processing results of the first film forming process according to the embodiment.

FIG. 4B is a diagram illustrating an example of the processing results of the third film forming process according to the embodiment.

DETAILED DESCRIPTION

Hereinafter, embodiments of a film forming method and film forming apparatus disclosed herein will be described in detail with reference to the drawings. In addition, the disclosed film forming method and film forming apparatus are not limited by these embodiments.

Embodiments

Figure 1:
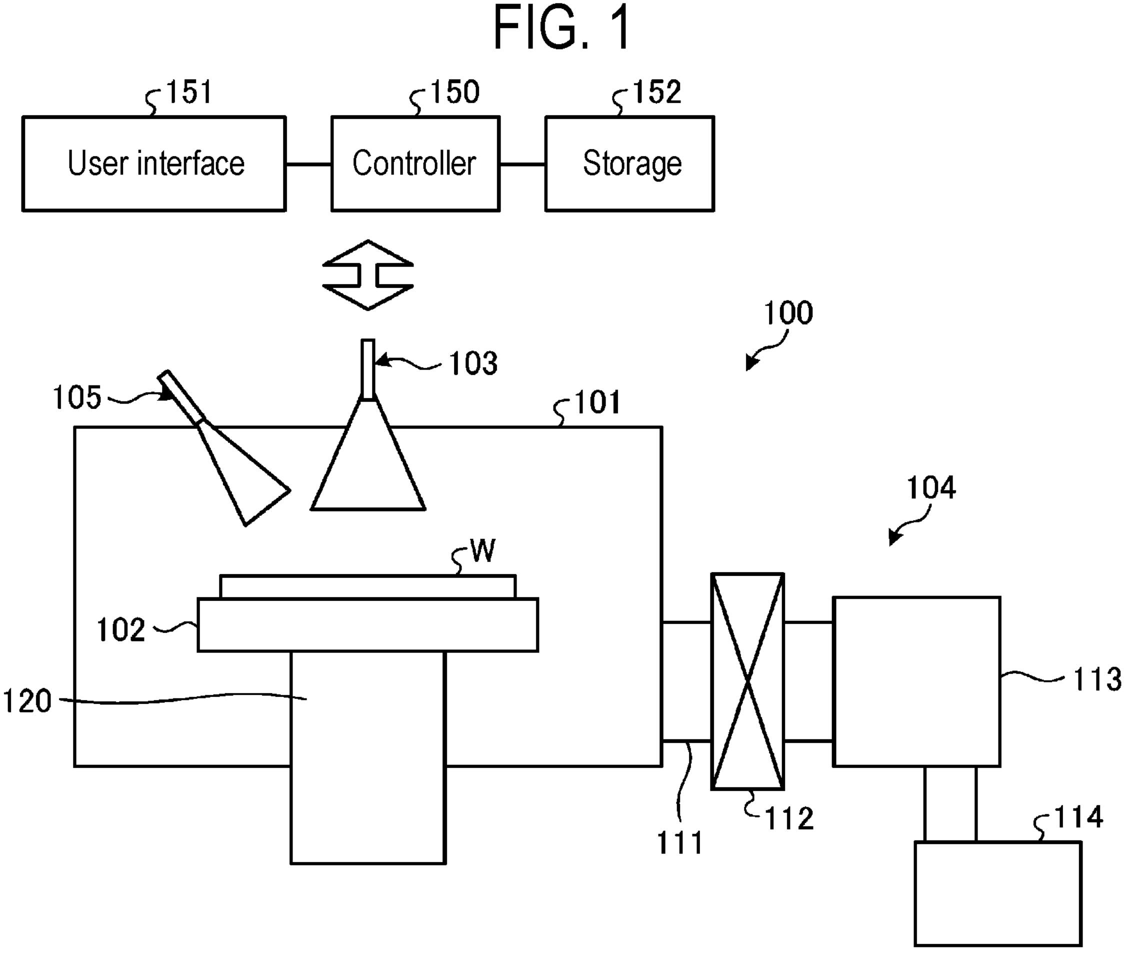
FIG. 1 is a cross-sectional diagram illustrating an example of a schematic configuration of a film forming apparatus according to an embodiment.

Embodiments will be described later. First, an example of a film forming apparatus for performing a film forming method of the present disclosure will be described. FIG. 1 is a cross-sectional diagram illustrating an example of a schematic configuration of a film forming apparatus 100 according to an embodiment. The film forming apparatus 100 illustrated in FIG. 1 includes a chamber 101, a stage 102, a gas supply mechanism 103, an exhaust device 104, an excitation mechanism 105, and a controller 150.

The chamber 101 is made of, for example, a metallic material such as aluminum and an alloy thereof. The chamber 101 accommodates a substrate W such as a semiconductor wafer, which is a film formation target. The stage 102 is provided inside the chamber 101. The substrate W is placed on the stage 102.

The gas supply mechanism 103 and the excitation mechanism 105 are provided on a ceiling plate of the chamber 101. The gas supply mechanism 103 supplies various gases used in a film forming process into the chamber 101. For example, the gas supply mechanism 103 introduces perfluorocarbon gases (PFC gases) such as a c-$C_4F_8$ gas and a $SF_6$ gas, which serve as a processing gas used in the film forming process, into the chamber 101.

The excitation mechanism 105 applies energy to the substrate W to excite a surface of the substrate W. For example, the excitation mechanism 105 includes a discharge tube, and causes electrical discharge of a noble gas (He gas, Ar gas, or the like), a $H_2$ gas, or a $N_2$ gas inside the discharge tube to generate low-speed electrons ($Ek \leq 200$ eV) or quasi-stable excited species (He*, Ar* or the like) of the noble gas, or H atoms or N atoms and excite the surface of the substrate W through irradiation. In addition, both the gas supply mechanism 103 and the excitation mechanism 105 may be provided on a sidewall of the chamber 101.

The sidewall of the chamber 101 has an opening, and is provided with the exhaust device 104 via an exhaust pipe 111 connected to the opening. The exhaust device 104 includes a gate valve 112, a molecular turbo pump 113, and an auxiliary exhaust pump 114. An interior of the chamber 101 is exhausted via the exhaust pipe 111 by the molecular turbo pump 113 and the auxiliary exhaust pump 114 of the exhaust device 104. An internal pressure of the chamber 101 is controlled by the gate valve 112 of the exhaust device 104.

The stage 102 is made of a metallic material, for example, oxygen-free copper (Cu). The substrate W is placed on an upper surface of the stage 102. The stage 102 supports the placed substrate W. The stage 102 is supported by a support member 120, which extends upward from a bottom center of the chamber 101.

Although not illustrated, both the stage 102 and the support member 120 are provided with a cooler that cools the substrate W. The cooler includes a cooling mechanism such as oxygen-free copper (Cu) or a cryostat, and is configured to cool the stage 102, thereby cooling the substrate W via the stage 102. Further, the stage 102 may include a heat-transfer-gas supplier configured to supply a heat transfer gas to a gap between the stage and the substrate W. In addition, surfaces of the stage 102 and support member 120 may be plated with gold (Au) or chrome for the purpose of preventing the introduction of radiant heat from the surroundings.

The film forming apparatus 100 configured as described above is comprehensively controlled by the controller 150. The controller 150 is connected to a user interface 151 and a storage 152.

The user interface 151 includes an input part such as a keyboard used by a process manager to input commands for managing the film forming apparatus 100 and a display part such as a display to visualize and display the operational status of the film forming apparatus 100. The user interface 151 accepts various operations. For example, the user interface 151 accepts a predetermined operation of instructing the initiation of a plasma processing.

The storage 152 is a storage device that stores various data. For example, the storage 152 is a storage device such as a hard disk, a solid state drive (SSD), or an optical disk. In addition, the storage 152 may also be a data rewritable semiconductor memory such as a random access memory (RAM), a flash memory, or a non-volatile static random access memory (NVSRAM).

The storage 152 stores an operating system (OS) and various recipes executed in the controller 150. For example, the storage 152 stores various recipes, including a recipe for executing a film forming process of a film forming method to be described later. Further, the storage 152 stores various data used in these recipes. In addition, programs and data may be stored in computer-readable computer recording media (e.g., hard disks, CDs, flexible disks, semiconductor memories, or the like). Alternatively, programs and data may also be transmitted in real time from other devices, for example, through dedicated lines, for online use.

The controller 150 is a device that controls the film forming apparatus 100. As the controller 150, electronic circuits such as a central processing unit (CPU) and micro processing unit (MPU), or integrated circuits such as an application specific integrated circuit (ASIC) and a field programmable gate array (FPGA) may be employed. The controller 150 includes an internal memory for storing programs and control data that define various processing procedures and executes various processes using them.

The controller 150 controls each part of the film forming apparatus 100. For example, the controller 150 controls each part of the film forming apparatus 100 to perform the film forming process according to recipes of recipe data stored in the storage 152. In the film forming apparatus 100, the substrate W, which is a film formation target, is placed on the stage 102. The substrate W as the film formation target includes an exposed metal film and an insulating film on the surface thereof. For example, a copper (Cu) film as the metal film and a $SiO_2$ film as the insulating film are formed on the substrate W, and both the Cu film and the $SiO_2$ film are exposed on the surface of the substrate.

The film forming apparatus 100 performs the film forming process on the substrate W placed on the stage 102. For example, the film forming apparatus 100 uses the cooler to cool the substrate W placed on the stage 102 to a a temperature at which molecules of a c-$C_4F_8$ gas and a $SF_6$ gas condense on the surface of the substrate W. For example, the film forming apparatus 100 cools the substrate W to a temperature of 120 K or lower. In the present embodiment, for example, the substrate W is cooled to 80 K.

The film forming apparatus 100 reduces the internal pressure of the chamber 101 to $10^{-3}$ Torr or lower by the exhaust device 104. In the present embodiment, for example, the internal pressure of the chamber 101 is reduced to $10^{-4}$ Torr.

The film forming apparatus 100 performs film formation by supplying various gases used in the film forming process from the gas supply mechanism 103 into the chamber 101 while activating the noble gas (He, Ar or the like), the $H_2$ gas, or the $N_2$ gas using a discharge plasma or the like to generate low-speed electrons or quasi-stable excited species (He*, Ar* or the like) of the noble gas, or H atoms or N atoms and excite the surface of the substrate W through irradiation. For example, the film forming apparatus 100 supplies a processing gas including the c-$C_4F_8$ gas and the $SF_6$ gas from the gas supply mechanism 103 into the chamber 101 while exciting the surface of the substrate W by the excitation mechanism 105, thus forming an amorphous carbon film containing fluorine (hereinafter abbreviated as a-C:F film) as a carbon-containing film on the metal film. Types and flow rates of gases supplied as the processing gas are, for example, as follows.

Processing Gas c-$C_4F_8$ gas: 0.001 to 100 sccm (particularly 0.01 to 1 sccm)

$SF_6$ gas: 0.001 to 100 sccm (particularly 0.01 to 1 sccm)

In addition, as the processing gas, a perfluorocarbon gas such as $CF_4$, $C_2F_6$, $C_3F_8$, $C_6F_{14}$($C_nF_{2n+2}$) or $C_6F_6$ may be used instead of the c-$C_4F_8$ gas, and a fluorine-containing gas such as a $NF_3$ gas may be used instead of the $SF_6$ gas.

Here, in the film forming process of the film forming method according to the present embodiment, film formation results when the ratio of the c-$C_4F_8$ gas to the $SF_6$ gas in the processing gas was changed will be described.

Figure 2A:
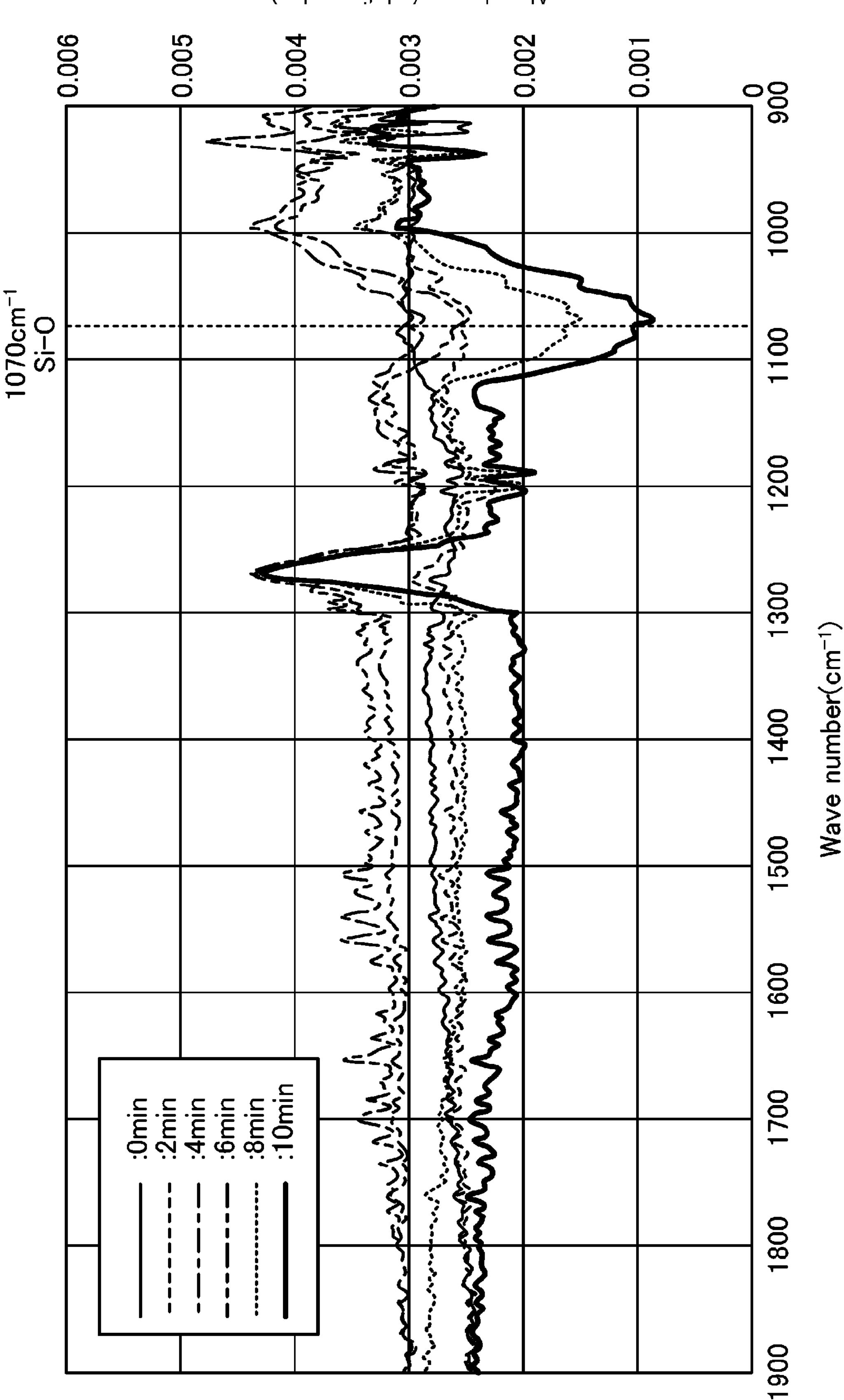
FIG. 2A is a diagram illustrating an example of processing results of a first film forming process according to an embodiment.

First, the film formation results of a first film forming process will be described. In the first film forming process, film formation was performed on the substrate W with a $SiO_2$ film exposed on a surface thereof by changing the ratio of the c-$C_4F_8$ gas to the $SF_6$ gas to supply a processing gas with 100% $SF_6$ gas into the chamber 101 while exciting the surface of the substrate W. FIG. 2A is a diagram illustrating an example of processing results of the first film forming process according to an embodiment. FIG. 2A illustrates absorbance for each wave number at each timing including immediately after the initiation of the first film forming process (0 min) and 2 minutes (2 min), 4 minutes (4 min), 6 minutes (6 min), 8 minutes (8 min), and 10 minutes (10 min) during the first film forming process. The data in FIG. 2A was obtained by measuring a time-dependent infrared absorption spectrum using an infrared spectrophotometer, for example, by providing a transmission window in the chamber 101. The waveform near 1070 $cm^{-1}$ in the infrared absorption spectrum corresponds to the component of $SiO_2$. As illustrated in FIG. 2A, the waveform near 1070 $cm^{-1}$ decreases along with the lapse of a processing time. As can be seen, when the $SF_6$ gas is 100%, the $SiO_2$ film on the substrate W is etched. FIG. 2B is a diagram illustrating an example of the processing results of the first film forming process according to the embodiment. FIG. 2B illustrates a change in a processing time of the first film forming process for the substrate W and a change in a thickness of the $SiO_2$ film exposed on the surface of the substrate W. As illustrated in FIG. 2B, the thickness of the $SiO_2$ film decreases and the $SiO_2$ film is etched along with the lapse of the processing time.

Figure 3:
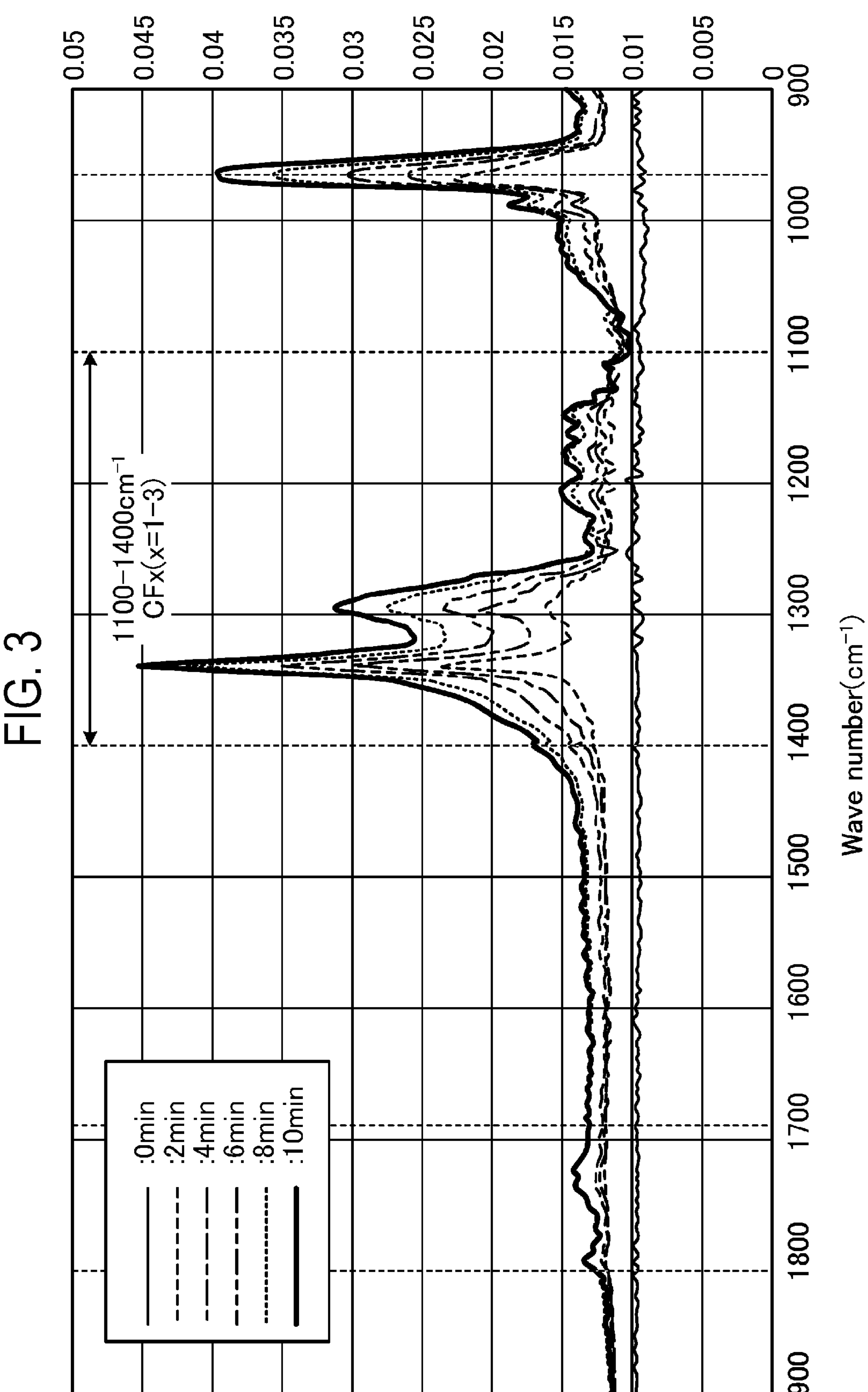
FIG. 3 is a diagram illustrating an example of processing results of a second film forming process according to an embodiment.

Next, film formation results of a second film forming process will be described. In the second film forming process, film formation was performed on the substrate W with a $SiO_2$ film exposed on a surface thereof by changing the ratio of the c-$C_4F_8$ gas to the $SF_6$ gas to supply a processing gas with 100% c-$C_4F_8$ gas into the chamber 101 while exciting the surface of the substrate W. FIG. 3 is a diagram illustrating an example of the processing results of the second film forming process according to an embodiment. FIG. 3 illustrates absorbance for each wave number at each timing including immediately after the initiation of the second film forming process (0 min) and 2 minutes (2 min), 4 minutes (4 min), 6 minutes (6 min), 8 minutes (8 min), and 10 minutes (10 min) during the second film forming process. The waveform near 1100 to 1400 $cm^{-1}$ in the infrared absorption spectrum corresponds to the absorption due to the vibrational mode of Cf-based ($CF_x$, x=1 to 3) amorphous carbon containing fluorine. As illustrated in FIG. 3, the waveform near 1100 to 1400 $cm^{-1}$ increases along with the lapse of a processing time. As can be seen, when the c-$C_4F_8$ gas is 100%, a Cf-based film such as amorphous carbon is formed on the $SiO_2$ film of the substrate W.

Figure 4A:
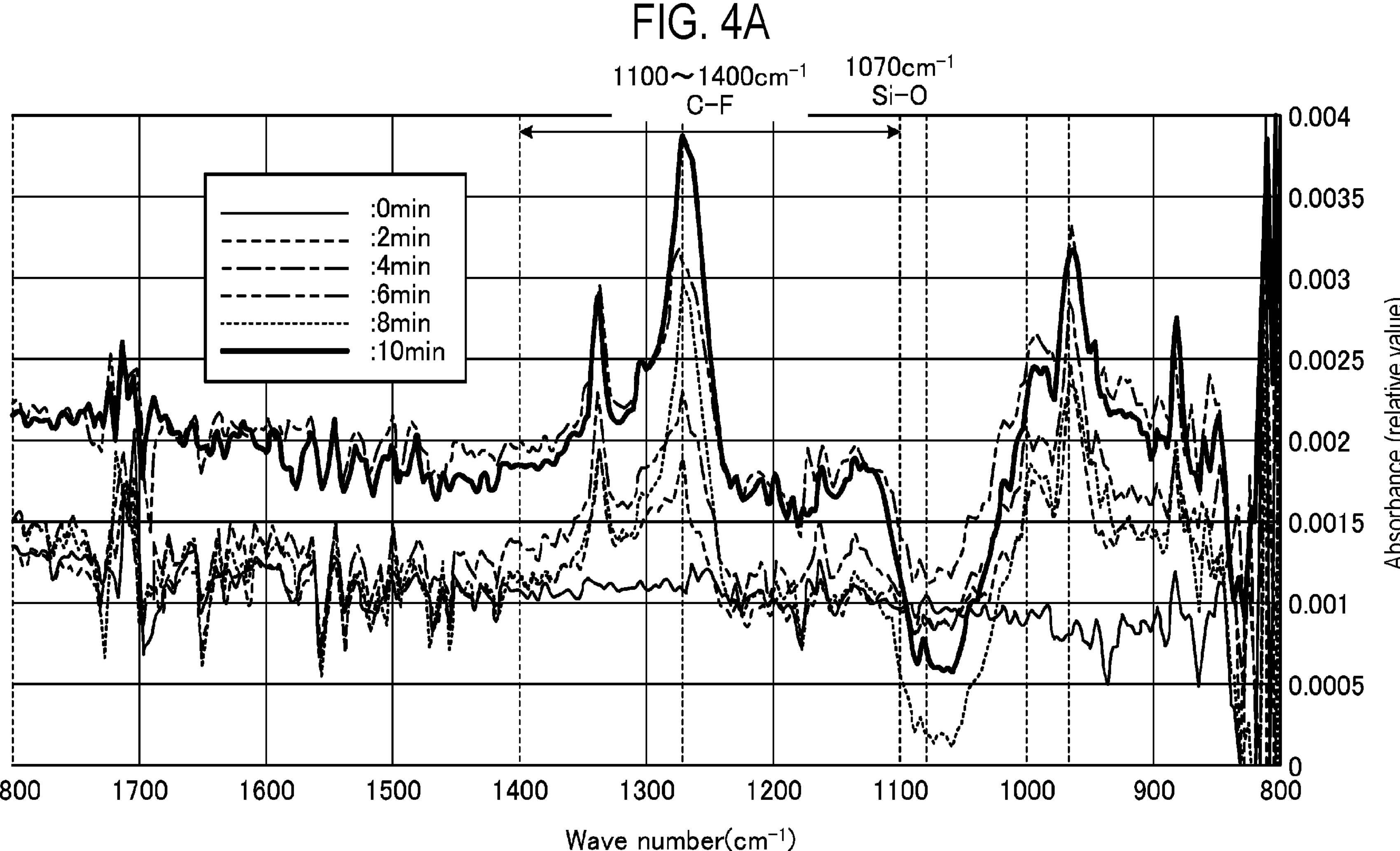
FIG. 4A is a diagram illustrating an example of processing results of a third film forming process according to an embodiment.

Next, film formation results of a third film forming process will be described. In the third film forming process, film formation was performed on the substrate W with a $SiO_2$ film exposed on a surface thereof by changing the ratio of the c-$C_4F_8$ gas to the $SF_6$ gas to supply a processing gas including the c-$C_4F_8$ gas and the $SF_6$ gas in a ratio of 1:1 (50% each) into the chamber 101 while exciting the surface of the substrate W. FIG. 4A is a diagram illustrating an example of the processing results of the third film forming process according to an embodiment. FIG. 4A illustrates absorbance for each wave number at each timing including immediately after the initiation of the third film forming process (0 min) and 2 minutes (2 min), 4 minutes (4 min), 6 minutes (6 min), 8 minutes (8 min), and 10 minutes (10 min) during the third film forming process. The waveform near 1070 $cm^{-1}$ in the infrared absorption spectrum corresponds to the component of $SiO_2$. As illustrated in FIG. 4A, the waveform near 1070 $cm^{-1}$ decreases along with the lapse of a processing time. As can be seen, when the c-$C_4F_8$ gas and the $SF_6$ gas are in a ratio of 1:1, the $SiO_2$ film on the substrate W is etched. FIG. 4B is a diagram illustrating an example of the processing results of the third film forming process according to the embodiment. FIG. 4B illustrates a change in the processing time of the third film forming process for the substrate W and a change in the thickness of the $SiO_2$ film exposed on the surface of the substrate W. As illustrated in FIG. 4B, the thickness of the $SiO_2$ film decreases and the $SiO_2$ film is etched along with the lapse of the processing time.

Figure 5:
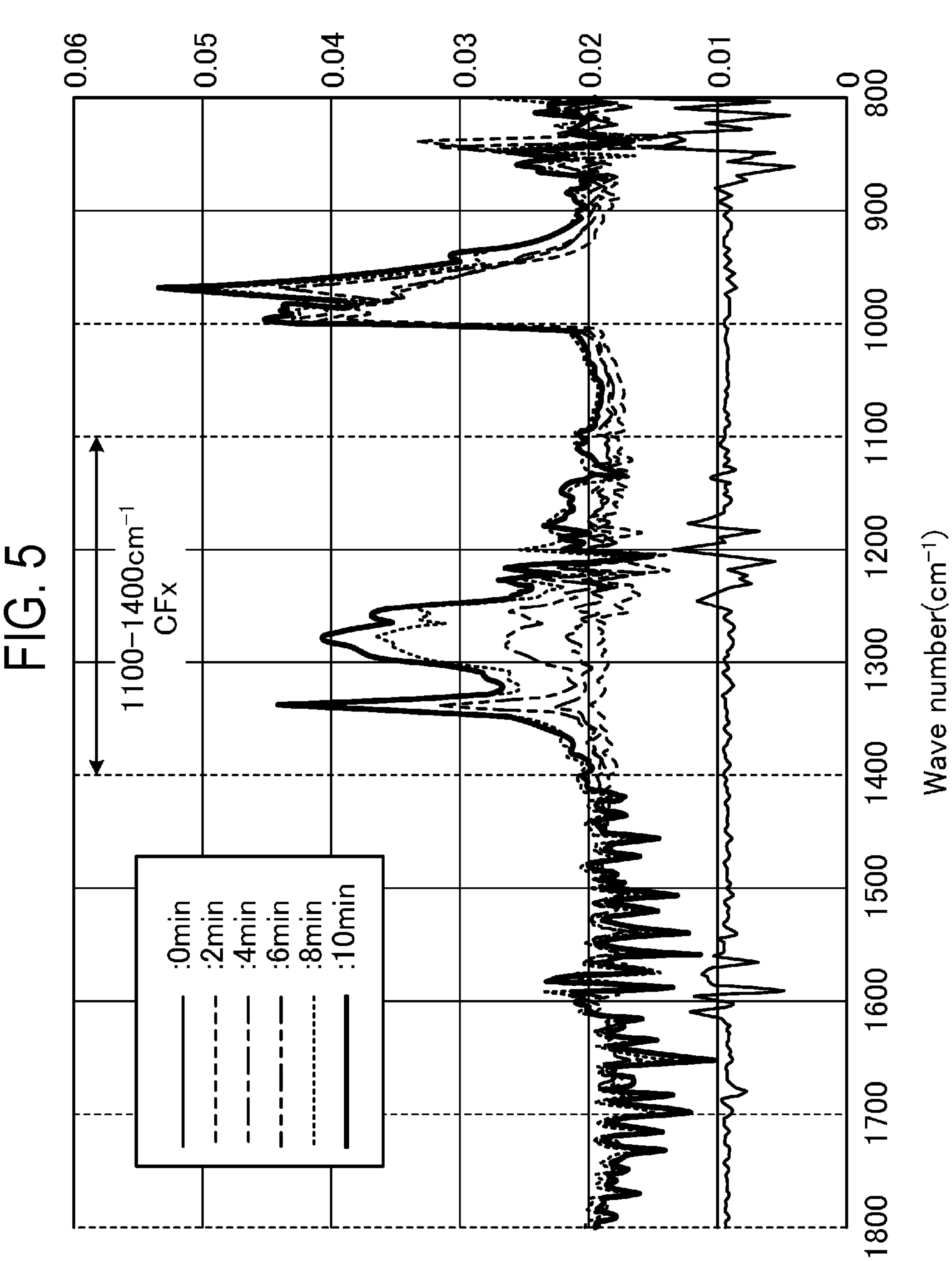
FIG. 5 is a diagram illustrating an example of processing results of a fourth film forming process according to an embodiment.

Next, film formation results of a fourth film forming process will be described. In the fourth film forming process, film formation was performed on the substrate W with a Cu film exposed on a surface thereof by changing the ratio of the c-$C_4F_8$ gas to the $SF_6$ gas to supply a processing gas including the c-$C_4F_8$ gas to the $SF_6$ gas in a ratio of 1:1 (50% each) into the chamber 101 while exciting the surface of the substrate W. FIG. 5 illustrates absorbance for each wave number at each timing including immediately after the initiation of the fourth film forming process (0 min) and 2 minutes (2 min), 4 minutes (4 min), 6 minutes (6 min), 8 minutes (8 min), and 10 minutes (10 min) during the fourth film forming process. The waveform near 1100 to 1400 $cm^{-1}$ in the infrared absorption spectrum corresponds to the absorption due to the vibrational mode of Cf-based ($CF_x$, x=1 to 3) amorphous carbon containing fluorine. As illustrated in FIG. 5, the waveform near 1100 to 1400 $cm^{-1}$ increases along with the lapse of a processing time. As can be seen, when the c-$C_4F_8$ gas and the $SF_6$ gas is in a ratio of 1:1 (50% each), a CF-based film such as amorphous carbon is formed on the Cu film of the substrate W.

From the results of the third and fourth film forming processes illustrated in FIGS. 4A, 4B and 5, when the ratio of the c-$C_4F_8$ gas to the $SF_6$ gas in the processing gas is 1:1, the CF-based film such as amorphous carbon is formed on the Cu film of the substrate W. On the other hand, the $SiO_2$ film on the substrate W is etched. As can be seen, when the ratio of the c-$C_4F_8$ gas to the $SF_6$ gas in the processing gas is 1:1, it is possible to selectively form a film on the Cu film without forming a mask, given that both the Cu film and the $SiO_2$ film are exposed on the substrate W. In the film forming process of the film forming method according to the embodiment, by adjusting the ratio of c-$C_4F_8$ gas to $SF_6$ gas in the processing gas to be between 1:3 and 3:1, it is possible to selectively form a film on the Cu film of the substrate W without forming a mask.

Figures 6A, 6B, 6C, 6D, 6E:
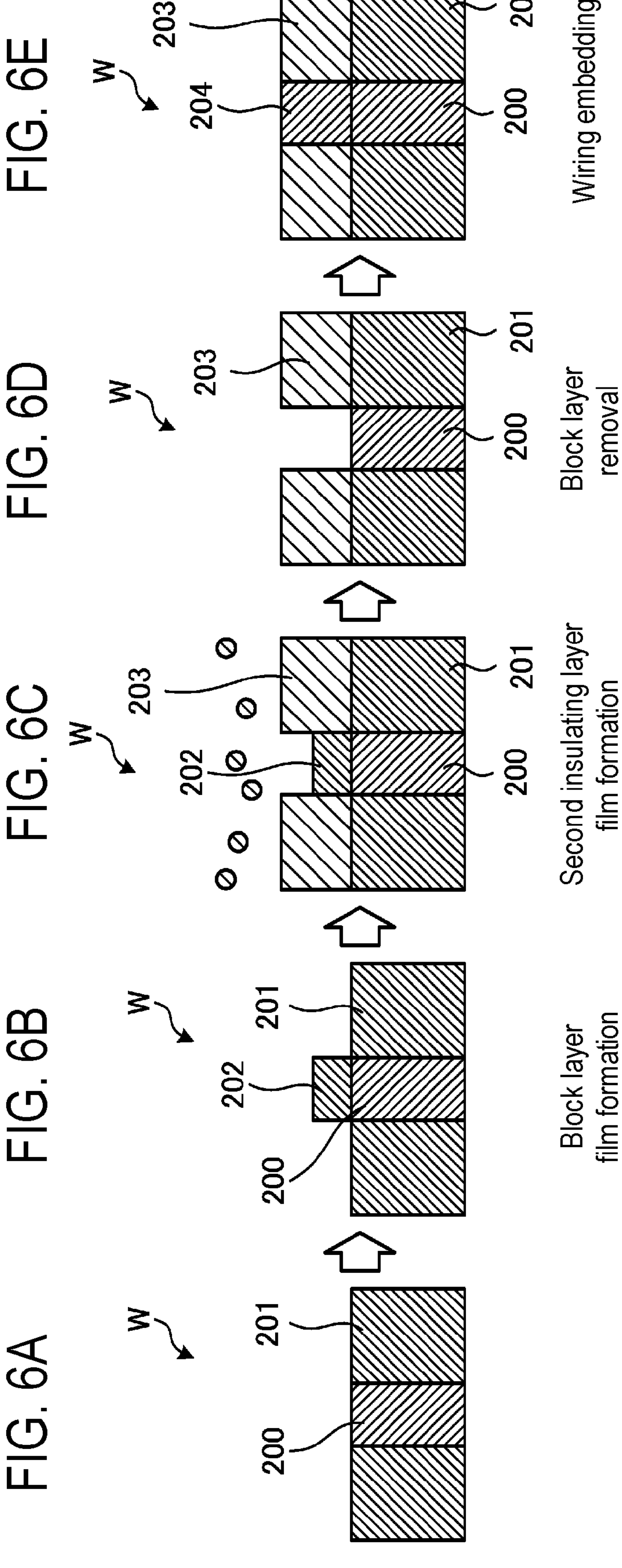
FIGS. 6A to 6E are diagrams illustrating an example of a manufacturing process for a semiconductor device.

Next, an example of a manufacturing process for a semiconductor device using the film forming process of the film forming method according to an embodiment will be described. FIGS. 6A to 6E are diagrams illustrating an example of the manufacturing process for a semiconductor device. In FIGS. 6A to 6E, a change in the substrate W in each operation is illustrated in a simulated manner. FIG. 6A illustrates a Cu film 200 and a $SiO_2$ film 201 exposed on the surface of the substrate W. By the film forming process of the film forming method according to the embodiment, a a-C:F film 202 is selectively formed on the Cu film 200 of the substrate W (FIG. 6B). This a-C:F film 202 is used as a process block during a next film forming process. For example, a second insulating film 203 is formed on the substrate W using the a-C:F film 202 as a block layer (FIG. 6C). For example, after forming the a-C:F film 202, the film forming apparatus 100 supplies an insulating-film raw material gas from the gas supply mechanism 103 into the chamber 101 to form the second insulating film 203 on the $SiO_2$ film 201 using the a-C:F film 20 as a mask. At this time, a small amount of the second insulating film 203 is also deposited on the a-C:F film 202. Next, a block layer removal process is performed on the substrate W to remove the a-C:F film 202 serving as a block layer from the substrate W (FIG. 6D). This exposes the Cu film 200. Subsequently, an embedding process for a wiring layer 204 using a metal is performed on the substrate W (FIG. 6E). As such, the operations illustrated in FIGS. 6A to 6E may be implemented by the film forming process of the film forming method according to an embodiment for selectively forming the film on the Cu film 200 of the substrate W.

Figure 7:
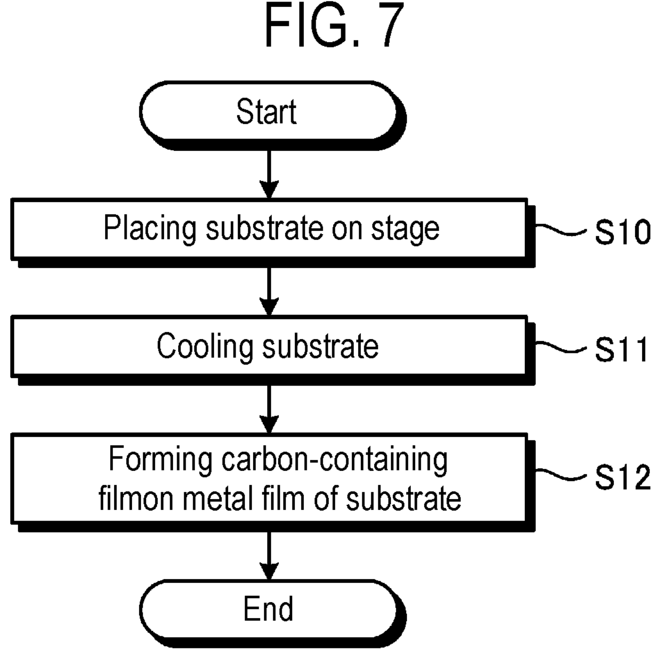
FIG. 7 is a flowchart illustrating an example of a flow of a film forming method according to an embodiment.

Next, a processing operation when performing the film forming process of the film forming method according to an embodiment will be described. FIG. 7 is a flowchart illustrating an example of a flow of the film forming method according to an embodiment.

In the film forming apparatus 100, the substrate W with a metal film and an insulating film exposed on the surface thereof is placed on the stage 102 (S10). For example, the substrate W with a Cu film and a $SiO_2$ film exposed on the surface thereof is placed on the stage 102.

In the film forming apparatus 100, the substrate W is cooled to a temperature at which molecules of a $cC_4F_8$ gas and a $SF_6$ gas condense on the surface of the substrate W (S11). For example, the substrate W is cooled to 80 K.

In the film forming apparatus 100, a processing gas including the c-$C_4F_8$ gas and the $SF_6$ gas is supplied from the gas supply mechanism 103 into the chamber 101 while the surface of the substrate W is excited by the excitation mechanism 105, leading to the formation of a carbon-containing film on the metal film (S12). Operation S12 is performed for a processing time until a required film thickness is obtained, and then the processing is terminated.

Thus, the film forming apparatus 100 according to the present embodiment may selectively form a film on a metal film of the substrate W, with the metal film and the insulating film exposed on the surface thereof, without forming a mask.

In addition, the above-described embodiment has described an example where the excitation mechanism 105 activates the noble gas (He, Ar or the like.), the $H_2$ gas, or the $N_2$ gas using a discharge plasma or the like to generate and supply low-speed electrons or quasi-stable excited species (He*, Ar* or the like) of the noble gas, or the H atoms or the N atoms into the chamber 101 while exciting the surface of the substrate W by applying energy to the substrate W. However, the present disclosure is not limited thereto. The excitation mechanism 105 may have an ultraviolet source that generates ultraviolet light, and may apply energy to the substrate W to excite the surface of the substrate W through the irradiation of the substrate W with the generated ultraviolet light from the ultraviolet source. Further, the excitation mechanism 105 may apply energy to the substrate W to excite the surface of the substrate W through the generation of a plasma from the noble gas in the chamber 101.

As described above, the film forming method according to the embodiment selectively performs film formation. The film forming method includes a cooling operation S11 and a film forming operation S12. The cooling operation includes cooling the substrate W to the temperature at which molecules of the c-$C_4F_8$ gas and the $SF_6$ gas condense on the surface of the substrate W, the substrate including the metal film and the insulating film exposed on the surface thereof and being supported inside the chamber. The film forming operation includes forming a carbon-containing film on the metal film by supplying the processing gas including the c-$C_4F_8$ gas and the $SF_6$ gas into the chamber 101 while exciting the surface of the substrate W. Thus, the film forming method according to the embodiment allows a film to be selectively formed on the metal film of the substrate W, with the metal film and the insulating film exposed on the surface thereof, without forming a mask.

Further, the cooling operation cools the substrate W to 120 K or lower. Thus, the film forming method according to the embodiment allows the molecules of the c-$C_4F_8$ gas and the $SF_6$ gas to condense on the surface of the substrate W.

Further, the metal film is a Cu film. The insulating film is a $SiO_2$ film. Thus, the film forming method according to the present embodiment allows film formation to be selectively performed on the Cu film of the substrate W without forming a mask.

Further, the film forming operation supplies the processing gas including the c-$C_4F_8$ gas and the $SF_6$ gas in a ratio of 1:3 to 3:1 into the chamber 101. Thus, the film forming method according to the present embodiment allows film formation to be selectively performed on the metal film of the substrate W, with the metal film and the insulating film exposed on the surface thereof, without forming a mask.

Further, the film forming method according to the embodiment further includes an insulating-film forming operation. The insulating-film forming operation includes, after forming the carbon-containing film, supplying an insulating-film raw material gas into the chamber 101, and forming a second insulating film on the insulating film using the carbon-containing film as a mask. Thus, the film forming method according to the embodiment allows the second insulating film to be selectively formed on the insulating film.

Although the embodiments have been described above, the embodiments disclosed herein should be considered to be exemplary and not restrictive in all respects. In fact, the above-described embodiment may be implemented in various forms. Further, the above-described embodiment may be omitted, replaced or modified in various embodiments without departing from the scope of the appended claims and their gist.

For example, the above-described embodiment has described an example where the substrate W is a semiconductor wafer, but is not limited thereto. The substrate W may be of various types.

In addition, the embodiments disclosed herein should be considered to be exemplary and not limitative in all respects. In fact, the above-described embodiments may be implemented in various forms. Further, the above embodiments may be omitted, replaced, or modified in various ways without departing from the scope and spirit of the appended claims.

In addition, the following appendices are further disclosed with respect to the above embodiments.

(Appendix 1)

A film forming method of selectively performing film formation, the film forming method comprising:

a cooling operation of cooling a substrate to a temperature at which molecules of a c-$C_4F_8$ gas and a $SF_6$ gas condense on a surface of the substrate, the substrate having a metal film and a first insulating film which are exposed on the surface and being supported inside a chamber; and a film forming operation of forming a carbon-containing film on the metal film by supplying a processing gas including the c-$C_4F_8$ gas and the $SF_6$ gas into the chamber while exciting the surface of the substrate.

(Appendix 2)

In the film forming method of Appendix 1 above, the cooling operation cools the substrate to 120 K or lower.

(Appendix 3)

In the film forming method of Appendix 1 or 2 above, the metal film is a Cu film, and the first insulating film is a $SiO_2$ film.

(Appendix 4)

In the film forming method of any one of Appendixes 1 to 3 above, the film forming operation supplies the processing gas including the c-$C_4F_8$ gas and the $SF_6$ gas in a ratio of 1:3 to 3:1 into the chamber.

(Appendix 5)

The film forming method of any one of Appendixes 1 to 3 above further includes: an insulating-film forming operation of, after forming the carbon-containing film, supplying an insulating-film raw material gas into the chamber, and forming a second insulating film on the first insulating film using the carbon-containing film as a mask.

(Appendix 6)

A film forming apparatus includes:

a chamber in which a stage is provided to support a substrate with a metal film and an insulating film exposed on a surface of the substrate;

a cooler configured to cool the substrate supported on the stage to a temperature at which molecules of a c-$C_4F_8$ gas and a $SF_6$ gas condense on the surface of the substrate;

a supplier configured to supply a processing gas including the c-$C_4F_8$ gas and the $SF_6$ gas into the chamber;

an excitation mechanism configured to excite the surface of the substrate; and a controller configured to perform control to form a carbon-containing film on the metal film by supplying the processing gas from the supplier into the chamber while exciting the surface of the substrate by the excitation mechanism.

EXPLANATION OF REFERENCE NUMERALS

100: film forming apparatus, 101: chamber, 102: stage, 103: gas supply mechanism, 104: exhaust device, 105: excitation mechanism, 112: gate valve, 113: molecular turbo pump, 114: auxiliary exhaust pump, 150: controller, 151: user interface, 152: storage, 200: Cu film, 201: $SiO_2$ film, W: substrate

What is claimed is:

1. A film forming method of selectively performing film formation, the film forming method comprising:

a cooling operation of cooling a substrate to a temperature at which molecules of a c-$C_4F_8$ gas and a $SF_6$ gas condense on a surface of the substrate, the substrate having a metal film and a first insulating film which are exposed on the surface and being supported inside a chamber; and a film forming operation of forming a carbon-containing film on the metal film by supplying a processing gas including the c-$C_4F_8$ gas and the $SF_6$ gas into the chamber while exciting the surface of the substrate.

2. The film forming method of claim 1, wherein the cooling operation cools the substrate to 120 K or lower.

3. The film forming method of claim 1, wherein the metal film is a Cu film, and the first insulating film is a $SiO_2$ film.

4. The film forming method of claim 1, wherein the film forming operation supplies the processing gas including the c-$C_4F_8$ gas and the $SF_6$ gas in a ratio of 1:3 to 3:1 into the chamber.

5. The film forming method of claim 1, further comprising: an insulating-film forming operation of, after forming the carbon-containing film, supplying an insulating-film raw material gas into the chamber, and forming a second insulating film on the first insulating film using the carbon-containing film as a mask.

6. A film forming apparatus comprising:

a chamber in which a stage is provided to support a substrate with a metal film and an insulating film exposed on a surface of the substrate;

a cooler configured to cool the substrate supported on the stage to a temperature at which molecules of a c-$C_4F_8$ gas and a $SF_6$ gas condense on the surface of the substrate;

a supplier configured to supply a processing gas including the c-$C_4F_8$ gas and the $SF_6$ gas into the chamber;

an excitation mechanism configured to excite the surface of the substrate; and a controller configured to perform control to form a carbon-containing film on the metal film by supplying the processing gas from the supplier into the chamber while exciting the surface of the substrate by the excitation mechanism.

* * * * *